United States Patent
Tobben et al.

[11] Patent Number: 5,977,635
[45] Date of Patent: Nov. 2, 1999

[54] MULTI-LEVEL CONDUCTIVE STRUCTURE INCLUDING LOW CAPACITANCE MATERIAL

[75] Inventors: Dirk Tobben, Fishkill, N.Y.; Peter Weigand, Unterhaching, Germany

[73] Assignee: Siemens Aktiengesellschaft, Munich, Germany

[21] Appl. No.: 08/939,208

[22] Filed: Sep. 29, 1997

[51] Int. Cl.$^6$ .................................................. H01L 23/48
[52] U.S. Cl. ........................ 257/760; 257/758; 257/635
[58] Field of Search ................................. 257/758, 760, 257/750, 635, 640, 641, 644

[56] References Cited

U.S. PATENT DOCUMENTS

| | | | |
|---|---|---|---|
| 5,310,700 | 5/1994 | Lien et al. | 257/758 |
| 5,548,159 | 8/1996 | Jeng | 257/760 |
| 5,691,573 | 11/1997 | Avanzino et al. | 257/758 |
| 5,789,818 | 8/1998 | Havemann | 257/758 |
| 5,847,464 | 12/1998 | Singh et al. | 257/752 |

*Primary Examiner*—Nathan K. Kelley
*Attorney, Agent, or Firm*—Stanton C. Braden

[57] ABSTRACT

A method for forming a multi-level conductive structure on an integrated circuit. The method includes forming a first conductive layer 108 and forming a first dielectric layer 112 above the first conductive layer. The method further includes forming a second conductive layer 302 above the first dielectric layer. There is also included etching through the second conductive layer and at least partially into the first dielectric layer to form a trench 706 in the second conductive layer and the first dielectric layer, thereby removing at least a portion of the dielectric layer and forming a first conductive line 503 and a second conductive line 505 in the second conductive layer. Further, the method includes depositing a low capacitance material 908 into the trench. The low capacitance material represents a material having a dielectric constant lower than a dielectric constant of the first dielectric layer.

17 Claims, 4 Drawing Sheets

MULTI-LEVEL CONDUCTIVE STRUCTURE INCLUDING LOW CAPACITANCE MATERIAL

BACKGROUND OF THE INVENTION

The present invention relates to the fabrication of integrated circuits. More particularly, the present invention relates to improved techniques for reducing capacitive coupling between conductive lines and/or conductive plugs in an integrated circuit (IC).

In a typical integrated circuit, conductive lines, e.g., metal lines, may be employed to couple selected devices on a substrate together to achieve the designed functionality. In modern, vertically integrated IC's, multiple conductive layers may be employed to satisfy the interconnect requirement while minimizing the size of the IC. These conductive layers are typically insulated from one another by one or more dielectric layers. Vias may then be employed, where desired, to interconnect conductive lines in different conductive layers together.

To facilitate discussion, FIGS. 1–6 depict the conventional process for forming the upper level conductive lines in multiple conductive layers on an integrated circuit. The structures formed by the figures herein may be employed, for example, in fabricating dynamic random access memory (DRAM) circuits. Although only the upper level conductive lines and the latter stages of forming multi-level conductive lines are shown to simplify illustration, it should be borne in mind that the invention disclosed herein applies equally well to other conductive layers that may underlie the upper level conductive lines. Referring initially to FIG. 1, conductive lines 103, 105, 114, and 106, which are formed from conductive layer 108 (such as a metal layer), are shown disposed on a substrate 110. Substrate 110 may represent, for example, a silicon substrate and may include a plurality of devices implemented therein. Conductive lines 103, 105, 114, and 106 may represent, for example, aluminum interconnect lines and may be etched out of conductive layer 108 using a conventional etch process.

Above conductive layer 108, there is deposited a first dielectric layer 112. After being deposited, first dielectric layer 112 is typically planarized by a conventional planarizing process such as chemical-mechanical polish (CMP). In FIG. 2, a dielectric etch step is then employed to etch a via 203 and a via 205 through first dielectric layer 112 using a photoresist mask 204. Although vias 203 and 205 are shown to have tapered walls, the via walls may in fact be vertical if desired.

In FIG. 3, a conductive layer 302 comprising, for example, aluminum or one of its alloys, is deposited above first dielectric layer 112 and into vias 203 and 205. Inside vias 203 and 205, the conductive material forms conductive plugs 303 and 305 respectively. These conductive plugs 303 and 305 serve to interconnect conductive layer 302 with respective conductive lines 103 and 105 in underlying conductive layer 108.

Alternatively, a layer of plug material may be deposited above first dielectric layer 112 of FIG. 2 and etched or polished back to form conductive plugs within vias 203 and 205. For example, the conductive plugs may be formed of tungsten. Thereafter, another conductive layer, e.g., aluminum or one of its alloys, may be blanket deposited above dielectric layer 112 to form electrical contact with the conductive plugs formed earlier.

In FIG. 4, conductive layer 302 is etched using an appropriate photoresist mask 502 to form conductive lines 503, 505, and 508 as shown. Conductive line 503 is shown coupled to conductive line 103 through conductive plug 303 in via 203 while conductive line 505 is shown coupled to conductive line 105 through conductive plug 305 in via 205.

In FIG. 5, a liner layer 502, typically representing a thin (e.g., about 1,000 angstroms thick) TEOS layer is blanket deposited over conductive lines 503, 505, and 508 as well as above the surface of dielectric layer 112 (after the photoresist that was employed to etch the conductive lines has been removed). Thereafter, a nitride passivation layer 602 is deposited above liner layer 502 (FIG. 6). Nitride layer 602 may be, for example, about 7,000 angstroms thick. As shown in FIG. 6, nitride layer 602 also fills in the trench between conductive lines 503, 505, and 508.

It has been found that the prior art multi-level conductive structure of FIG. 6 has certain disadvantages. For example, a high level of capacitive coupling has been found to exist among the various conductive lines and conductive plugs of the prior art multi-level conductive structure. With reference to FIG. 6, for example, capacitive coupling exists between adjacent conductive lines 503 and 505 through nitride layer 602 and first dielectric layer 112. The level of capacitive coupling therebetween has been found to be relatively high due to the high dielectric constant of the nitride material (e.g., a dielectric constant of about 7–9 for a typical nitride layer) and the high dielectric constant of the underlying oxide dielectric (e.g., a dielectric constant of about 4 for a typical oxide layer).

Further, capacitive coupling exists between conductive line 503 and underlying conductive line 103, as well as between conductive line 505 and underlying conductive line 105. Since some of the field lines traverse the relatively high capacitance dielectric layer 112, the level of capacitive coupling therebetween has been found to be relatively high as well.

Further, capacitive coupling has also been found among adjacent conductive plugs, e.g., between conductive plug 303 and 305 through dielectric layer 112 of FIG. 6. Again, due to the relatively high capacitance of dielectric layer 112, the capacitive coupling between adjacent conductive plugs has been found to be relatively high as well.

As can be appreciated by those skilled in the art, the high level of capacitive coupling among the conductive lines and plugs of the prior art multilevel conductive structure increases the time delays as well as contributes to a high level of cross-talk and capacitive loss in the final integrated circuit, thereby degrading performance. Further, the high level of capacitive coupling requires a higher operating voltage, which increases heat dissipation and delay during operation. This is particularly true for capacitive coupling to and from conductive lines in the uppermost metal layer since these conductive lines typically contain the largest and longest metal leads (e.g., up to 1 micron high by 0.8 micron wide and up to several millimeters long), since they are designed carry power and ground to the rest of the IC. A high level of capacitive coupling to and from these upper level metal leads tends to greatly degrades the IC's performance in terms of capacitance, delay, and power dissipation.

In view of the foregoing, there are desired improved multi-level conductive structures, and methods therefor, that advantageously reduce the capacitive coupling among their various conductive lines and plugs in order to improve performance.

SUMMARY OF THE INVENTION

The invention relates, in one embodiment, to a multi-level conductive structure on an integrated circuit, which includes a first conductive layer and a first dielectric layer disposed above the first conductive layer. The multi-level conductive structure further includes a second conductive layer disposed above the first dielectric layer. The second conductive layer includes a first conductive line and a second conductive line. The multi-level conductive structure also includes a layer of low capacitance material disposed into a trench between the first conductive line and the second conductive line. The trench is formed through the second conductive layer and at least substantially through the first dielectric layer. The low capacitance material represents a material having a dielectric constant lower than a dielectric constant of the first dielectric layer.

In another embodiment, the invention relates to a method for forming a multi-level conductive structure on an integrated circuit. The method includes forming a first conductive layer and forming a first dielectric layer above the first conductive layer. The method further includes forming a second conductive layer above the first dielectric layer. There is also included etching through the second conductive layer and at least partially into the first dielectric layer to form a trench in the second conductive layer and the first dielectric layer, thereby removing at least a portion of the dielectric layer and forming a first conductive line and a second conductive line in the second conductive layer. Further, the method includes depositing a low capacitance material into the trench. The low capacitance material represents a material having a dielectric constant lower than a dielectric constant of the first dielectric layer.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

The present invention will now be described in detail with reference to a few illustrative embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The present invention relates to a multi-level conductive structure employed in an IC. Such IC is, for example, a random access memory (RAM), a dynamic random access memory (DRAM), a synchronous DRAM (SDRAM), and a read only memory (ROM). Other ICs, such as an application specific IC (ASIC), a merged DRAM-logic circuit (embedded DRAM), or any other logic circuit, are also useful. Typically, numerous integrated circuits are formed on the wafer in parallel. After processing is finished, the wafer is diced to separate the ICs to individual chips. The chips are then packaged, resulting in a final product that is used in, for example, consumer products such as computer systems, cellular phones, personal digital assistants (PDAs), and other electronic products.

In one embodiment, relatively high capacitance dielectric material used in a multi-level conductive structure is replaced by a lower capacitance material to reduce capacitive coupling to and from the conductive lines and plugs. In accordance with in the overlying conductive layer (i.e., between conductive lines to insulate the conductive lines from one another) but also into the underlying dielectric layer. These deeper trenches remove some of the higher capacitance dielectric material in the regions between adjacent conductive lines. The trenches are then filled with a lower capacitance material, which replaces the removed dielectric material.

Once the trenches between adjacent conductive lines are filled with the lower capacitance material, a nitride layer may then be deposited above the substrate. Because the trenches have already been filled with the lower capacitance material prior to the nitride deposition, little, if any, of the higher capacitance nitride material is deposited in the region between adjacent conductive lines.

During operation, the absence of the higher capacitance dielectric and nitride material in between adjacent conductive lines and plugs advantageously reduces the capacitive coupling to and from the conductive lines and plugs. The reduced capacitive coupling in turn minimizes the capacitive loss, thereby improving performance (e.g., in terms of delay, power consumption, and the like).

Figure 7:
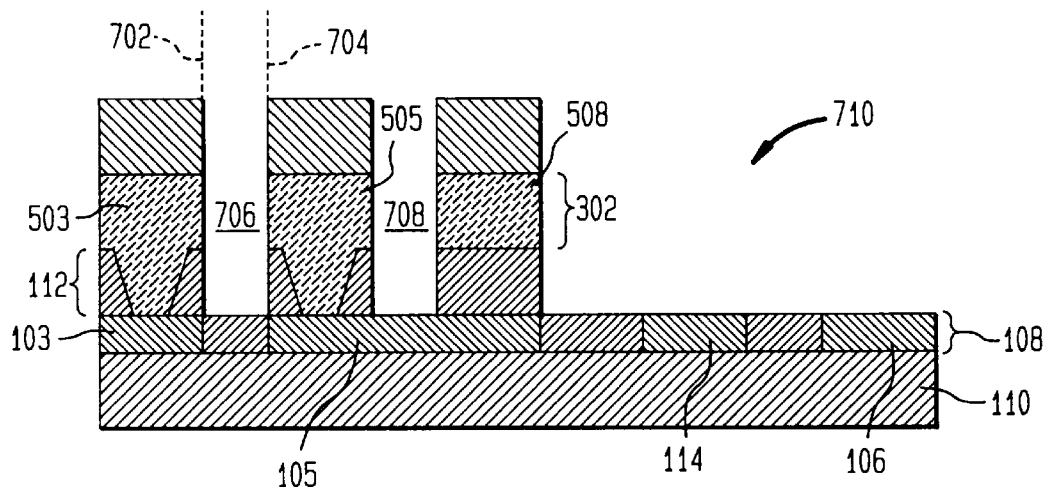
FIGS. 7–10 depict, in accordance with one embodiment of the present invention, the inventive technique for forming the multi-level conductive structure.

The features and advantages of the present invention may be better understood with reference to the drawings and discussions below. In FIG. 7, the trenches between adjacent conductive lines (e.g., between conductive lines 503 and 505 in metal layer 302) have been extended into dielectric layer 112. In this manner, some of the dielectric material in dielectric layer 112 is removed from the regions between adjacent conductive lines, e.g., in the region between dash lines 702 and 704 in FIG. 7. This is in contrast to the situation of prior art FIG. 4 wherein the trenches between conductive lines 503 and 505 of FIG. 4 stops at the interface between conductive layer 302 and dielectric layer 112 (i.e., leaving dielectric layer 112 substantially unetched by the trench etch).

In one embodiment, trench 706 of FIG. 7 is etched into dielectric layer 112 by a conventional reactive ion etching (RIE) etch process. Further, the same photoresist mask employed to etch conductive layer 108 (to form conductive lines 503, 505, and 508) may also be employed to perform the subsequent dielectric etch to create the trenches, thereby eliminating the need for an additional photolithography step. Note that the trench etch leaves the previously formed vias (i.e., the vias in dielectric layer 112) substantially untouched since these vias are disposed under the conductive lines, which are protected by the overlying photoresist mask.

As shown in the case of FIG. 7, the dielectric etch step that etches trench 706 out of dielectric layer 112 may end at the interface of underlying conductive layer 108 (e.g., by an end point technique). As will be understood to those skilled in the art, however, many of the benefits conferred by the techniques of the present invention are also realized if the etching of trench 706 extends substantially into dielectric layer 112 but stops before reaching metal layer 108. Note that at least some dielectric material remains between conductive lines 103, 105, 114, and 106 to insulate these conductive lines from one another an to provide mechanical support. The dielectric etch step also creates a trench 708 into dielectric layer 112 in the region between adjacent conductive line 505 and 508, and forms an open area 710 in FIG. 8.

Although it may be desired, in some cases, to replace much of the high capacitance dielectric material with the low-K fill (i.e., to etch substantially through the dielectric layer), the exact depth of the trenches is determined, in part, by the availability of the protective photoresist material during etching. This is because some photoresist material may be eroded away during etching, and the trench etch may have to be stopped before reaching the interface of underlying conductive layer 108 so as to avoid the undue damage to the conductive lines in the overlying conductive layer (e.g., conductive lines 503, 505, and 508 in layer 302 of FIG. 7).

Figure 8:
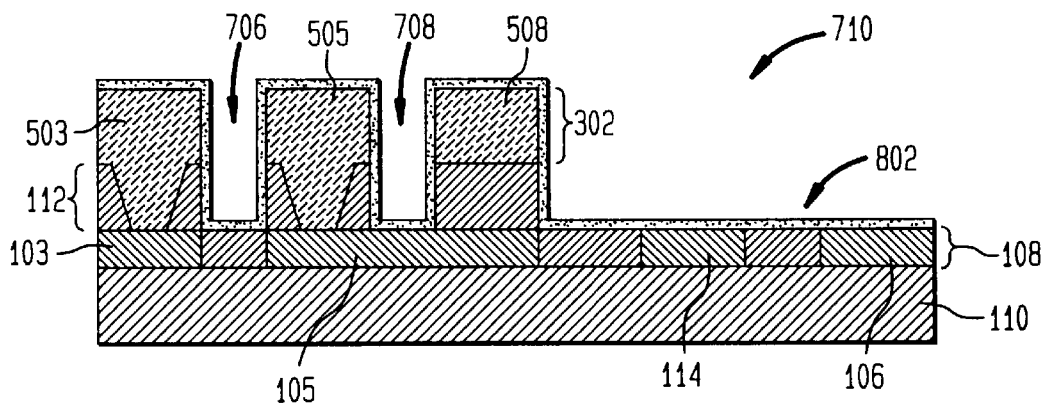

In FIG. 8, an optional oxide liner layer 802 (e.g., a TEOS liner) is conformably deposited over conductive lines 503, 505, and 508 of metal layer 302, into trenches 706 and 708, and over open area 710 of FIG. 7. Optional oxide liner layer 802 may represent any oxide with good step coverage and may be provided to prevent adhesion and corrosion problems, if needed, that may be associated with the low capacitance material subsequently deposited in FIG. 9. The liner also covers and protects the underlying conductive layer 108 from potential corrosion and adhesion problems vis-a-vis the subsequently deposited low capacitance material if any portion of underlying conductive layer 108 happens to be exposed after the trench etch.

Figure 9:
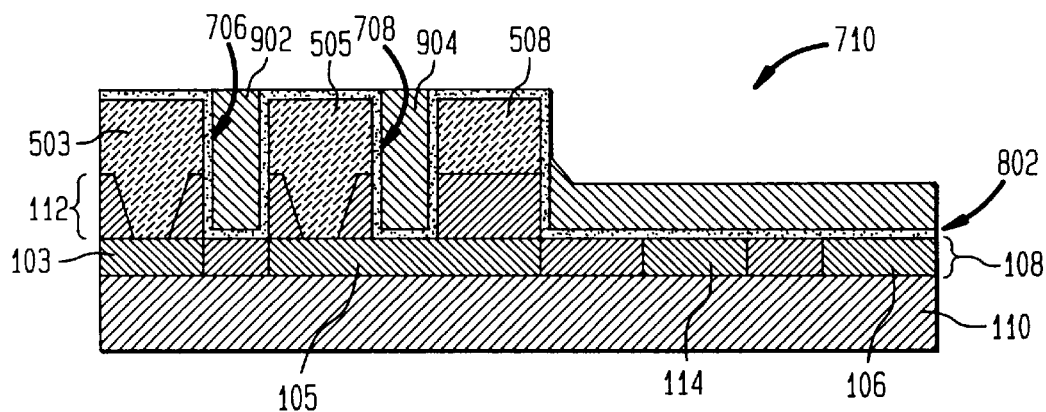

In FIG. 9, a low capacitance material is deposited into trenches 706 and 708, i.e., into the trenches that forms through metal layer 302 and at least partially through dielectric layer 112 in between the adjacent conductive lines. This low capacitance material forms low capacitance fills 902 and 904 in trenches 706 and 708 of FIG. 8. Note that the low capacitance material displaces the higher capacitance dielectric material that has been removed earlier from these trenches. Further note that the low capacitance fill material extends into the dielectric layer, i.e., dielectric layer 112 of FIG. 8.

As the term is used herein, a low capacitance dielectric material represents a material having a lower dielectric constant than the material it replaces, e.g., lower than the dielectric material of dielectric layer 112 or the nitride material in the case of FIG. 9. Preferably but not necessarily, the low capacitance material has a dielectric constant in the range below about 3. In one embodiment, the low capacitance material is preferably a low dielectric constant (low K) spin-on material such as hydrogen silsesquioxane SOG (e.g., Dow Corning's Fox®), methyl silsesquioxane SOG, organic spin-on polymers (including polyimides, polybenzoxazoles, polyarylethers, or the like), and even spin-on aerogels. A self-leveling chemical vapor deposition (CVD) film (e.g., Trikon Technologies's low-K Flowfill®) may also be used in accordance with yet another embodiment of the invention.

As is well known to those skilled in the art, the spin-on material typically follows the constant volume rule, i.e., it flows and fills the smaller topology such as trenches 706 and 708 while planarizing to form a constant thickness layer in the open area, e.g., open area 710. Accordingly, a constant thickness low capacitance layer is shown disposed over open area 710 in FIG. 9. Due to the constant volume rule, however, the thickness of the low capacitance material in open area 710 will be less than the depth of the trenches.

Figure 10:
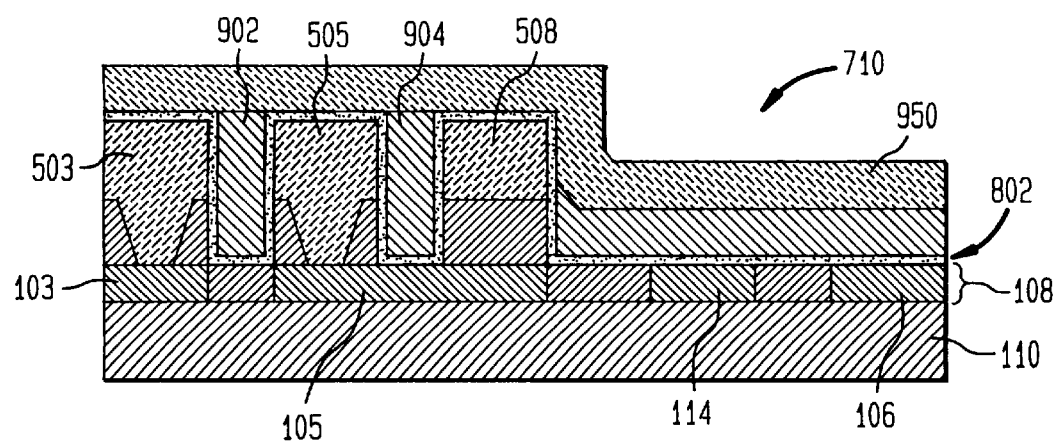

In FIG. 10, a nitride ($Si_xN_y$) layer 950 is conformably deposited over the entire structure for passivation purposes. Layer 950 may be any passivation layer such as, for example, PSG (phosphosilicate glass).

By etching the trenches into the dielectric layer, e.g., trench 706 into dielectric layer 112, and refilling the trench with a lower capacitance material, the invention advantageously removes the higher capacitance material from areas where field lines to and from the conductive lines and plugs are expected to traverse, and replaces the higher capacitance oxide and/or nitride material with a lower capacitance material.

The filling of the trenches with the lower capacitance material also permits the nitride layer, e.g., nitride layer 950 of FIG. 10, to be lifted above the conductive lines. In this manner, fewer of the field lines to and from the conductive lines traverse the higher capacitance nitride material. Instead, a substantial portion of the field lines to and from the conductive lines, e.g., conductive lines 503 and 505, now traverses through the lower capacitance fill material. In this manner, the capacitive coupling to and from the conductive lines are substantially minimized.

Figure 1:
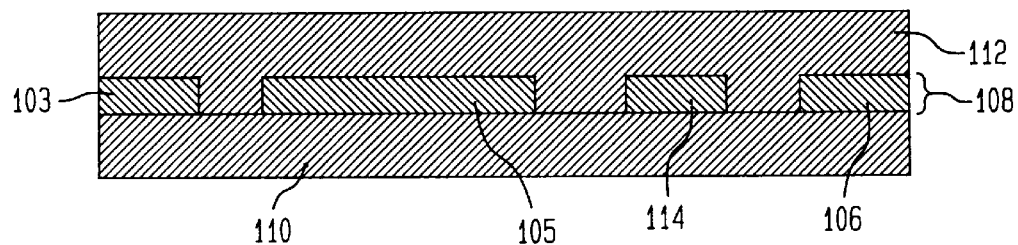
FIGS. 1–6 depict the prior art technique for forming a multi-level conductive structure.
Figure 2:
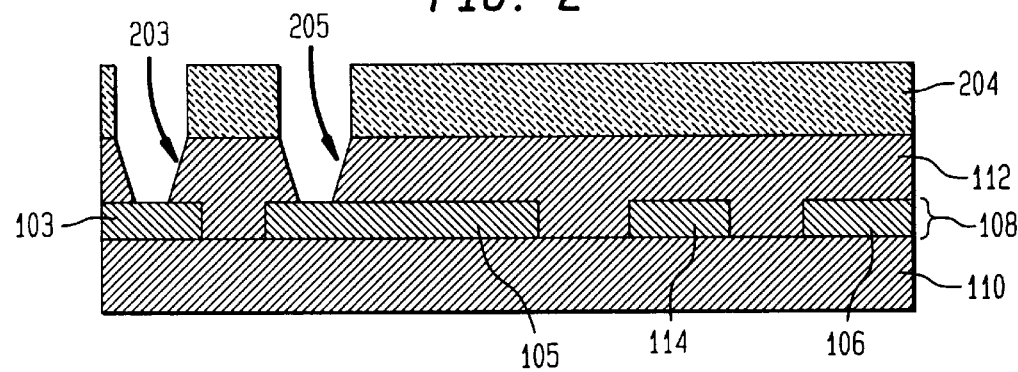
Figure 3:
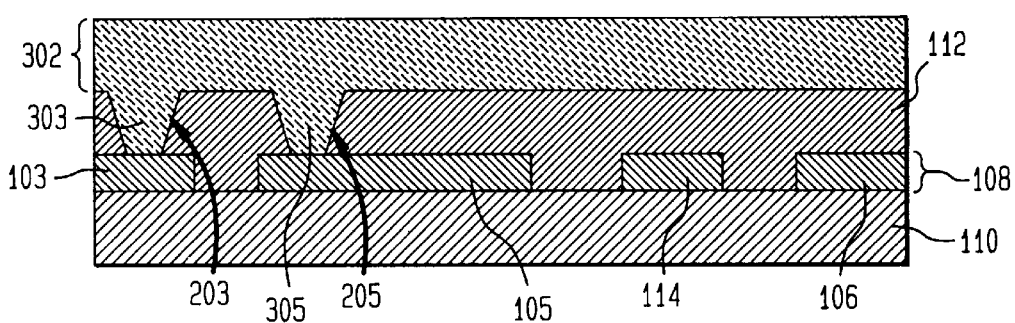
Figure 4:
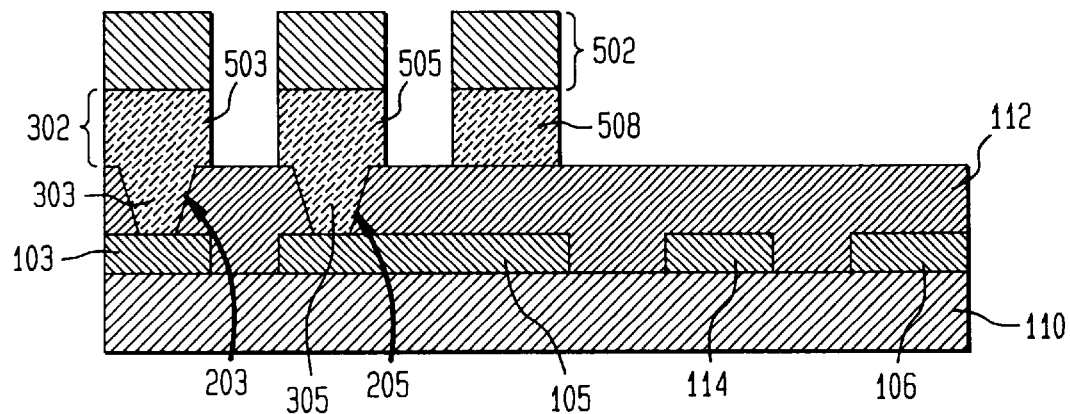
Figure 5:
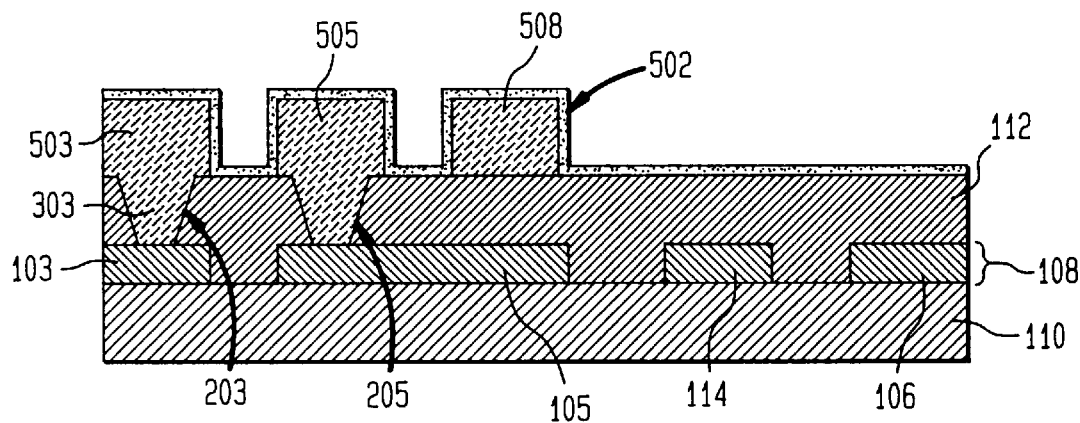
Figure 6:
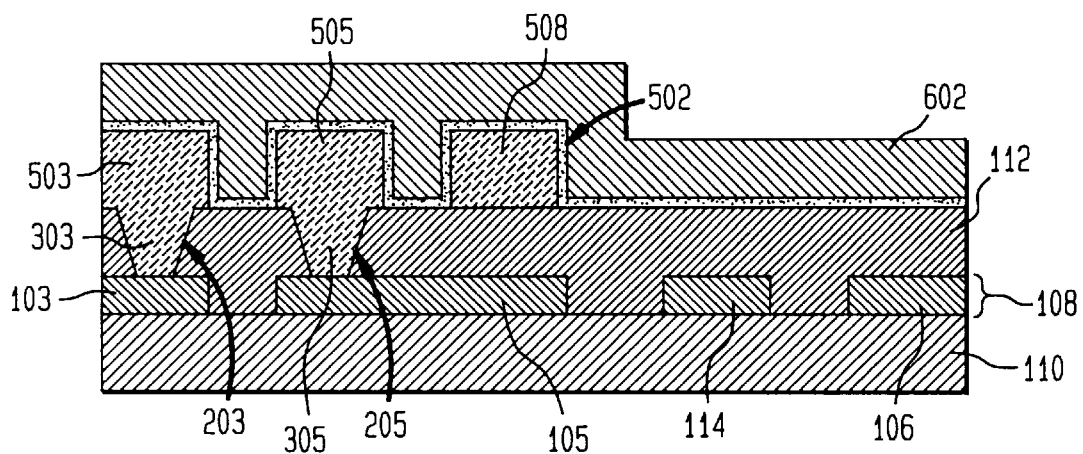

Further, the removal of the higher capacitance dielectric material from the region between adjacent conductive lines advantageously and substantially reduces the capacitive coupling between neighboring conductive plugs. With reference to FIG. 6, for example, the prior art multi-level structure permits some of the field lines between conductive plugs 303 and 305 to traverse the higher capacitance dielectric material of layer 112. Even if the prior art trenches (which do not substantially extend into the dielectric layer) are filled with a low K material, as is done in some prior art structures (i.e., even if the trenches between conductive lines 503/505 and conductive lines 505/508 of prior art FIG. 4 are filled with a low K material), this approach still does not address the fact that field lines between prior art conductive plugs 303 and 305 still traverse the higher capacitance dielectric material of dielectric layer 112 to cause a high degree of capacitive coupling therebetween. In contrast, a substantial portion of the field lines between adjacent conductive plug 303 and 305 of FIG. 10 now traverses low capacitance fill 902. In this manner, the capacitive coupling between these two conductive plugs 303 and 305 is substantially reduced in FIG. 10.

Some of the fringe field lines between upper conductive line 505 and lower conductive line 105 also traverses the low capacitance material of low capacitance fills 902 and 904. Accordingly, the capacitive coupling between upper conductive line 505 and lower conductive line 105 is also reduced.

If conductive layer 108 also represents the layer from which fuses (e.g., protection or address/enable fuses of a dynamic random access memory circuit) are fabricated, the multi-level conductive structure formation technique disclosed in connection with FIGS. 7–10 offers further advantages. To understand this aspect of the present invention, it should be appreciated that laser blowable fuses typically require a dielectric window of a predetermined thickness above the fuses during the fuse setting operation (i.e., when the fuses are blown by lasers). With reference to prior art FIG. 6, fuses 114 and 106 are shown covered by dielectric layer 112, liner layer 502, and nitride layer 602 in the prior art. To accommodate the fuse setting operation, an etching step is typically necessary to reduce the thickness of the layers above the fuses to the predefined thickness prior to the fuse setting operation.

However, the thickness of dielectric layer 112 in prior art FIG. 6 may vary from fuse to fuse due to the use of the chemical-mechanical polish process employed to planarize this layer. Because of this variability, it is difficult to design an etch step that accurately results in a dielectric window of a predetermined thickness above the fuses. By way of example, it is not uncommon to find nontrivial variations in the thickness of the dielectric windows from fuse to fuse in some prior art IC's.

In accordance with one aspect of the present invention, the removal of the dielectric material above the fuses and the replacement thereof by the deposition of the liner material (e.g., liner layer 802 in FIG. 10), the low capacitance material above open area 710, and nitride layer 950 advantageously eliminates the variability in the thickness of the layer stack above the fuses. This is because the removal of substantially all the dielectric material above the fuses (as seen in FIG. 7) eliminates the variability in the dielectric thickness that is present in the prior art due to the chemical-mechanical polish process employed to planarize the dielectric layer. Since deposition and spin-on processes are processes that allows the thicknesses of the layers formed thereby to be more accurately controlled (relative to the CMP process), the thickness of the layer stack above the fuses are more constant from fuse to fuse. Since the thickness of the layers above the fuses are more constant, the invention renders it possible to more accurately control the subsequent etch employed to form the dielectric windows above the fuses.

As can be appreciated from the foregoing, the removal and replacement of the higher capacitance dielectric and nitride materials in the regions between adjacent conductive plugs in dielectric layer 112 and between adjacent conductive lines in conductive layer 302 advantageously reduce the capacitive coupling to and from these structures during operation. It is contemplated that the inventive capacitive coupling reduction technique disclosed herein would yield substantial benefits when applied to the uppermost (i.e., final) conductive layer on the circuit. Nevertheless, the disclosed technique may be applied to any conductive layer in an IC to reduce the intra-level and inter-level capacitive coupling. As mentioned earlier, the reduced capacitive coupling in turn reduces the capacitive loss, which minimizes power consumption and permits the integrated circuit to operate at a lower voltage. Furthermore, the reduction in the capacitive coupling allows designers to specify a tighter pitch between the structures, thereby advantageously shrinking the size of the resultant integrated circuit.

In a nonobvious manner, the invention advantageously disposes some of the low capacitance material into the dielectric layer itself, e.g., in dielectric layer 112, to reduce capacitive coupling between adjacent conductive plugs in the dielectric layer and to/from the overlying conductive lines. The provision of the low capacitance material in this layer is nonobvious since it is well known that a low capacitance material should not be used in a layer where vias and conductive plugs are expected to form. This is because if dielectric layer 112 is form entirely of a low capacitance material, the formation of vias and conductive plugs therein may suffer from a phenomenon known as via poisoning (i.e., chemical reaction between the metal plug disposed in the via and moisture from the low capacitance material, which renders the conductive plug nonconductive).

In a nonobvious manner, the invention permits vias to be formed through the more stable, albeit higher capacitance, dielectric material, e.g., the dielectric material of dielectric layer 112, while replacing this higher capacitance dielectric material in other areas where no vias are expected, e.g., in trenches 706 and 708 of FIG. 8. In this manner, via poisoning is advantageously avoided in the vias while some of the higher capacitance dielectric material that lies in the regions where field lines between adjacent conductive lines and conductive plugs are expected to traverse may still be replaced by the low capacitance material.

While this invention has been described in terms of several illustrative embodiments, there are alterations, permutations, and equivalents which fall within the scope of this invention. It is therefore intended that the following appended claims be interpreted as including all such alterations, permutations, and equivalents as fall within the true spirit and scope of the present invention.

What is claimed is:

1. A multi-level conductive structure on an integrated circuit, said multi-level conductive structure comprising:

a first conductive layer;

a first dielectric layer disposed above said first conductive layer, said first dielectric layer having therein a first conductive plug and a second conductive plug;

a second conductive layer disposed above said first dielectric layer, said second conductive layer including a first conductive line and a second conductive line, said first conductive line being in electrical communication with said first conductive plug, said second conductive line being in electrical communication with said second conductive plug; and a layer of low capacitance material disposed into a trench between said first conductive line and said second conductive line, said trench being formed through said second conductive layer and at least substantially through said first dielectric layer to allow at least some of said low capacitance material to be disposed between said first conductive plug and said second conductive plug to reduce capacitive coupling therebetween, said low capacitance material representing a material having a dielectric constant lower than a dielectric constant of said first dielectric layer, wherein said first conductive plug is isolated from said low capacitance material by first dielectric material of said first dielectric layer.

2. The multi-level conductive structure of claim 1 wherein said low capacitance material represents a spin-on material.

3. The multi-level conductive structure of claim 1 wherein said trench is formed through said first dielectric layer to an upper surface of said first conductive layer.

4. The multi-level conductive structure of claim 1 further comprising an oxide liner layer, said oxide liner layer being disposed between said second conductive layer and said layer of low capacitance material.

5. The multi-level conductive structure of claim 4 wherein said low capacitance material represents a spin-on material.

6. The multi-level conductive structure of claim 5 wherein said spin-on material substantially fills said trench.

7. The multi-level conductive structure of claim 6 further comprising a second dielectric layer disposed above said layer of low capacitance material.

8. The multi-level conductive structure of claim 7 wherein said second dielectric layer represents a nitride layer.

9. The multi-level conductive structure of claim 8 wherein said dielectric constant of said low capacitance material is lower than a dielectric constant of said nitride layer.

10. A dynamic random access memory circuit, comprising:
- a first metal layer;
- a first dielectric layer disposed above said first metal layer, said first dielectric layer having therein a first metal plug and a second metal plug;
- a second metal layer disposed above said first dielectric layer, said second metal layer including a first metal line and a second metal line, said first metal line being in electrical communication with said first metal plug, said second metal line being in electrical communication with said second metal plug; and
- a layer of low capacitance material disposed into a trench between said first metal line and said second metal line, said trench being formed through said second metal layer and at least substantially through said first dielectric layer to allow at least some of said low capacitance material to be disposed between said first metal plug and said second metal plug to reduce capacitive coupling therebetween, said low capacitance material representing a material having a dielectric constant lower than a dielectric constant of said first dielectric layer,
- wherein said first conductive plug is isolated from said low capacitance material by first dielectric material of said first dielectric layer.

11. The dynamic random access memory circuit of claim 10 wherein said dielectric constant of said low capacitance material is below about 3.

12. The dynamic random access memory circuit of claim 10 wherein said trench is formed through said first dielectric layer to an upper surface of said first metal layer.

13. The dynamic random access memory circuit of claim 10 wherein said low capacitance material represents a spin-on material.

14. The dynamic random access memory circuit of claim 10 further comprising a second dielectric layer disposed above said layer of low capacitance material, said layer of low capacitance material substantially fills said trench.

15. The dynamic random access memory circuit of claim 14 wherein said second dielectric layer represents a nitride layer, said dielectric constant of said low capacitance material is lower than a dielectric constant of said nitride layer.

16. The multi-level conductive structure of claim 1 wherein said first conductive plug and said first conductive line rae formed of the same conductive material.

17. The dynamic random access memory of claim 10 wherein said first conductive plug and said first conductive line are formed of the same conductive material.

* * * * *